(12) United States Patent  (10) Patent No.: US 6,538,832 B1
Ranmuthu et al.  (45) Date of Patent: Mar. 25, 2003

(54) SINGLE ENDED PREAMPLIFIER HAVING MULTIPLE FIRST STAGE BANKS FOR IMPROVED NOISE CHARACTERISTICS

(75) Inventors: Indumini W. Ranmuthu, Plano, TX (US); Hong Jiang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 256 days.

(21) Appl. No.: 09/589,429

(22) Filed: Jun. 7, 2000

Related U.S. Application Data

(60) Provisional application No. 60/137,857, filed on Jun. 7, 1999.

(51) Int. Cl.[7] ............................................. G11B 5/09
(52) U.S. Cl. ............................ 360/46; 360/67; 360/63
(58) Field of Search ........................... 360/46, 67, 63, 360/66, 65

(56) References Cited

U.S. PATENT DOCUMENTS

| | | | |
|---|---|---|---|
| 5,144,502 A | * | 9/1992 | Somers .......................... 360/63 |
| 5,517,369 A | * | 5/1996 | Takeuchi et al. ............... 360/65 |
| 6,218,903 B1 | * | 4/2001 | Hashimoto et al. ........... 360/67 |

* cited by examiner

Primary Examiner—Alan T. Faber
(74) Attorney, Agent, or Firm—W. Daniel Swayze, Jr.; W. James Brady; Frederick J. Telecky, Jr.

(57) ABSTRACT

In hard disk drives (HDD), a magnetic read head moves over a portion of the hard disk when reading data. A preamplifier, having an initial amplification stage of the single ended type, connects to the magnetic read head and amplifies a data signal picked up by the magnetic read head. The preamplifier typically has multiple read heads, or channels. In order to reduce noise coming into the read channels of the preamplifier from the substrate capacitances of the input transistors connected to the read heads, the input transistors are grouped together into multiple banks that are multiplexed, or turn on separately. To further aid noise reduction, the poles of the single ended amplifier are matched, that is, the frequency response of the constant voltage side is matched to the frequency response to the signal side. This effectively reduces both ground noise and Vcc power supply noise as the the noise becomes common mode on the inputs to a differential amplifier that is connected to the single ended amplifier. Noise is further minimized by connecting the substrates of the switching transistors connected to the input transistors to magnetic read ground, as opposed to integrated circuit ground.

5 Claims, 4 Drawing Sheets

SINGLE ENDED PREAMPLIFIER HAVING MULTIPLE FIRST STAGE BANKS FOR IMPROVED NOISE CHARACTERISTICS

This application claims the benefit of provisional application Ser. No. 60/137,857 filed Jun. 7, 1999.

FIELD OF THE INVENTION

The invention relates generally to the field of information storage, more specifically to hard disk drives and in particular to preamplifier circuits.

BACKGROUND OF THE INVENTION

U.S. Pat. No. 5,831,888 entitled "Automatic Gain Control Circuit" and assigned to Texas Instruments Incorporated, the assignee of the present invention, sets forth generally the description of disk storage. Hard disk drives (HDD) are one type of disk storage that are particularly used in personal computers today. The HDD device generally includes a magnetic storage media, such as rotating disks or platters, a spindle motor, read/write heads, an actuator, a preamplifier, a read channel, a write channel, a servo controller, a memory and control circuitry to control the operation of the HDD and to properly interface the HDD to a host or system bus. The following U.S. Patents describe various aspects of HDD devices:

| | | | |
|---|---|---|---|
| 5,535,067 | Frequency Controlled Reference Generator | Issued | 07/09/96 |
| 5,570,241 | Single Channel, Multiple Head Servo ... | | 10/29/96 |
| 5,862,005 | Synchronous Detection Of Wide BI-Phase ... | | 01/19/99 |
| 5,793,559 | In Drive Correction Of Servo Pattern ... | | 08/11/98 |
| 5,719,719 | Magnetic Disk Drive With Sensing ... | | 02/17/98 |
| 5,444,583 | Disk Drive Having On-Board Triggered ... | | 08/22/95 |
| 5,448,433 | Disk Drive Information Storage Device ... | | 09/05/95 |
| 5,208,556 | Phase Lock Loop For Sector Servo System | | 05/04/93 |
| 5,642,244 | Method and Apparatus For Switching ... | | 06/24/97 |

Prior art FIG. 1 illustrates a disk/head assembly 12 and a preamplifier 14. The preamplifier 14 handles both read functions and write functions. Not illustrated in FIG. 1, for clarity, is the Magentoresistive (MR) head. The unshown MR head works through magnetic media and it has both functions, read and write, with a different portion of the head performing each function. The write function portion of the MR head is inductive and the read function portion of the head acts as a magnetic resistive element. A write occurs through an inductive element to the magnetic media disk assembly 12 and a read occurs by sensing the magnetic shifts in the disk assembly 12 by using the resistive read element. The preamplifier 14 connects to the unshown MR head.

Prior art FIG. 2 illustrates a portion of the read channel of preamplifier 14 of FIG. 1. The resistive portion of the unshown MR head is represented by the resistors Rmr 1–Rmr 6. An initial amplification stage 18 of preamplifier 14 connects to the resistive portion Rmr of the MR head. Later gain stages 20 of preamplifier 14 are connected to the outputs of initial amplification stage 18 at nodes NA and MB. The read path outputs flow from the later gain stages 20. The read channel inputs flow into preamplifier 14 from a head select logic stage. In typical mass storage devices of the HDD type, the preamplifier 14 may have as many as 1 to 8 channels. Transistor SW1 represents the read channel input enabling MOS transistor for head 1 of the 6 heads illustrated in FIG. 2. The other enabling MOS transistors for heads 2–6 are unillustrated for clarity. In the operational example explained below, since read head 1 is illustrated as the selected head, the input NPN transistors Q2–Q6 for the other heads are illustrated in the off condition with their bases being connected to the integrated circuit ground.

The architecture of initial amplification stage 18 of preamplifier 14 is constructed as that of a single ended amplifier as opposed to a differential amplifier; the single ended amplifier uses only one transistor Q11 to set the voltage on the load side of later gain stage 20. (As is known to one of ordinary skill in the art of amplifier design, a differential amplifier uses two transistors to establish the voltages on nodes N and M, one transistor for node N and one transistor on node M.) On one side of the single ended amplifier, the bias current Ib travels through the load resistor R1 and through the collector of transistor Q11 to set the voltage on node M. On the other side of the single ended amplifier, the bias current Ib/ travels through the scaling resistor R1 to set the voltage on node N. (The reference character represents the scale factor for the resistor. In this example, the scale factor is 20 and so the scaling resistor is illustrated as 20R1.) In hard disk drives, because of linearity problems during a read operation, the voltage on the read head (represented by VRmr) is biased up to a certain level, which is typically around 0.2 to 0.5 volts. This bias voltage VRmr is established through a feedback loop created by transconductance amplifier 22 across nodes M and N whose output is connected to the base of transistor Q11 through MOS switch SW1. This, in essence, creates a pseudo-balanced output on the reader load resistors such as would exist if a differential amplifier were used in the initial amplification stage.

In operation of prior art FIG. 2, when head 1 is selected, NPN bipolar transistors Q11 and Q1 are on. Together with the load resistor R1, they form a cascode amplifier. A cascode amplifier is a high bandwidth amplifier. The transistor Q1 is a common base amplifier and the transistor Q11 acts as a common base amplifier. As the magnetic resistive head moves over data, the head resistance Rmr varies. This can be modeled by an alternating current ac signal in series with the Rrnr resistor. The transistors Q1 and Q11 amplify this signal. The ac signal goes to the load resistor R1 and then to the base of emitter follower transistor Q8. Then, the signal goes to the node MB input of latter gain stage 20 that is a differential amplifier. The other input of the amplifier 20 is node NA that should be at a dc bias voltage equal to the voltage on the load resistor R1 node MB. The node NA constant voltage side of the later gain stage amplifier 20 should not have an alternating current signal on it. The reference side of single ended initial amplification stage 18 consists of transistors Qb, Q21 and the scaling resistor 20R1. This supplies a current Ib/ through the scaling resistor 20R1, which provides a voltage at node N. The transconductance amplifier 22 forms a feedback loop with the cascode amplifier Q1 and Q11. The purpose of the loop is to make sure that node M dc voltage on the signal side of the load resistor R1 is the same as the dc voltage on node N. If the dc voltage on node M and node N are the same, the input voltage on differential amplifier 20 at nodes NA. and nodes MB are the same. On node NA, there is no ac signal; on node MB there is an ac signal. If the dc voltages are equal, then the differential later gain stage amplifier 20 will amplify the ac signal and send it to further gain stages.

In operational summary of the example shown in prior art FIG. 2 wherein head 1 of the 6 illustrated heads is selected, when the magnetic resistive head moves to select data at head 1, an ac data signal appears on the resistive portion of the head represented by Rmr1. Transistors Q1 and Q11 amplify this data signal, by the load resistor R1 and the data signal appears at node M. There is no ac signal at node N. The ac data signal at load resistor R1 gets amplified by differential amplifier 20 and is output to further later gain stages. For selecting the read heads, the MOS switch SW1 connects the base of transistor Q1 to capacitor C1. When this occurs, all the current that goes through the load resistor R1 and transistor Q11 goes through transistor Q1. As stated earlier, all the other input transistors Q2–Q6 are not selected as connecting their bases to integrated circuit ground turns them off.

Supply noise is a problem for single ended preamplifier stages as it adversely affects the bit error rate of the preamplifier. That is, if noise is present, the preamplifier may incorrectly send the wrong data through the read channel. Noise may exist in several sources such as the Vcc power supply, ground and substrate. If the noise is not eliminated, it transfers from the first stage into later gain stages of the preamplifier and thus hinders the preamplifier's Power Supply Rejection (PSR) ability. (Those in the HDD industry use PSR as a rating criteria when choosing a manufacturers preamplifier; a better PSR rating is desirable as it reflects increased ability to eliminate noise from the power supply.)

As an example, as shown in prior art FIG. 2, one source of noise injection is the parasitic capacitance Cp formed by bipolar transistor Q1 collector to substrate capacitance. This parasitic capacitance Cp is illustrated by dotted line connections. If ground noise exists, it can come through this parasitic capacitance Cp and appear at node Y where transistor Q11 and load resistor R1 will amplify it and send it to the signal input node MB of later gain stage differential amplifier 20.

As an example, another source of noise injection is the thermal noise of the scaling resistor 20R1. To help control this noise, the prior art circuit of FIG. 2 adds a capacitor C2 in parallel with the scaling resistor 20R1. The capacitor C2 does not change the transfer function for the serial path of the output read signal; it does not change the gain or bandwidth of the amplifier. This C2 capacitor couples Vcc noise into node N.

The amount of coupling depends upon the frequency of the noise signal. Prior art FIG. 3 is a graph illustrating the amount of noise coupling between the different frequencies of the prior art circuit of FIG. 2. In FIG. 3, the value 0 DB means that if a signal having a reference unit amplitude is input into Vcc, a reference unit of amplitude is output by initial amplification stage 18. As the graph shows, any signal with less than zero DB is attenuated and any signal with DB greater than zero is a gain—it is magnified out. As the frequencies increase, the graph crosses 0 DB and moves upward. The desired frequency band for a HDD is from around 1 megahertz to about 200 megahertz as this is the frequency range at which signals are recorded on the disks. As the figure unfortunately shows, however, the graph crosses 0 DB during this frequency range.

It is thus an object of this invention to improve the PSR ability of a preamplifier. Noise coupled from the power supply, ground, substrate or other sources over the desired frequency range needs to be eliminated so that the data bit error rate of the hard disk drive can be improved.

Other objects and advantages of the invention herein will be apparent to those of ordinary skill in the art having the benefit of the description herein.

SUMMARY OF THE INVENTION

The invention herein increases the ability of a single ended initial amplification stage of a preamplifier to eliminate noise over the desired frequency range of about 1 megahertz to about 200 megahertz in hard disk drive applications. The head input transistors are grouped into banks with each bank having separate single ended drive transistors that are multiplexed together. This effectively reduces substrate capacitances of the bipolar NPN head input transistors. In addition, the frequency response of the constant voltage side of the input to the differential amplifier is matched to the frequency response of the signal side of the input to the differential amplifier; that is, the poles of the single ended amplifier are. matched so that the inputs to the differential amplifier are matched. This effectively reduces the ground noise coupled through substrate capacitance of NPN transistors as it becomes common mode to the differential amplifier. In further addition, power supply noise is reduced by pole matching in the input initial amplification stage as the capacitance is doubled on the constant voltage input to the differential amplifier while the resistance is halved on the signal input to the differential amplifier. This matches any Vcc power supply noise on the signal side to that on the constant voltage side of the differential amplifier.

DETAILED DESCRIPTION OF THE PREFERRED EMBODIMENT OF THE INVENTION

Figure 4:
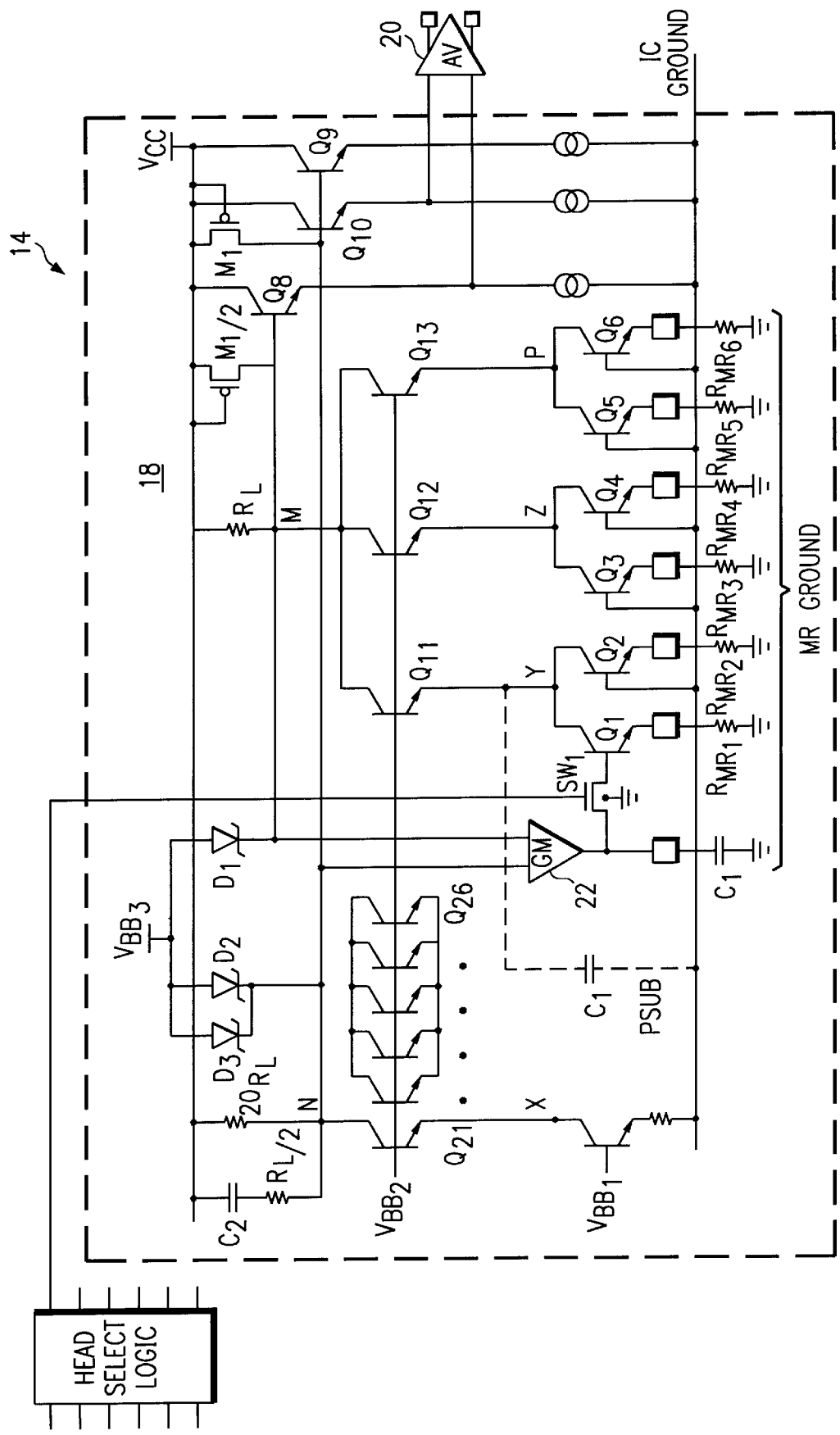
FIG. 4 is a schematic drawing illustrating the preferred embodiment of the inventive single ended initial amplification stage according to the invention.

FIG. 4 depicts an electrical schematic of the preferred embodiment of the inventive single ended preamplifier. By comparing FIG. 4 to FIG. 2, aspects of the inventive single ended amplifier can be readily seen as common reference numerals have been used in the figures. FIG. 4 illustrates the same example as prior art FIG. 2 wherein read head 1 is selected as input read head transistors Q2–Q6 are illustrated with their bases connected to ground.

In the initial amplification stage 18 of preamplifier 14 of FIG. 4, a balancing resistor R1/2 is added. The prior art capacitor C2 and the balancing resistor R1/2 are connected together in series. Since the capacitor C2 has a value of around 800 picoofarads, when the frequency impedance formula for a capacitor is applied, this value of capacitance is effectively an open circuit at low frequencies and a short circuit at high frequencies. The balancing resistor R1/2 (whose value is about one half of the load resistor R1) is added in series with capacitor C2 to maintain impedance on node N as the noise frequency increases and the capacitor C2 shorts out. The balancing resistor R1/2 does not affect the transfer function of the preamplifier as no signal is delivered to this pseudo-differential reference node since the single ended input is on the Rmr side.

Figure 1:
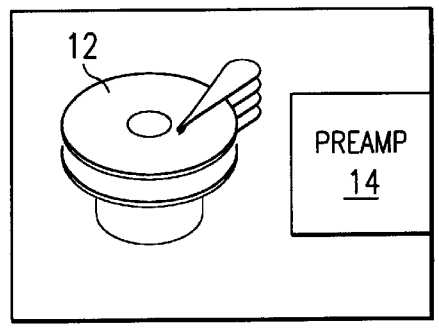
FIG. 1 is a prior art drawing illustrating a disk/head assembly and a preamplifier of a typical HDD device.
Figure 3:
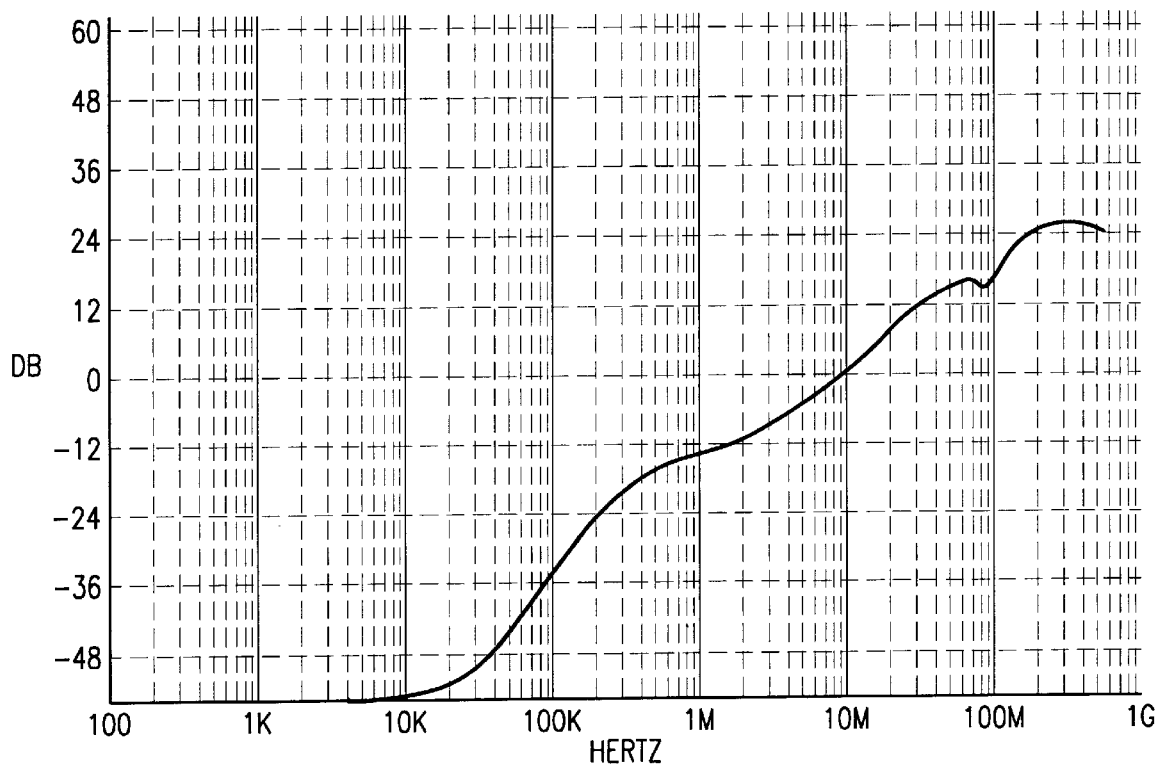
FIG. 3 is a graph illustrating noise amplification in the initial amplification stage of the preamplifier of FIG. 2.
Figure 2:
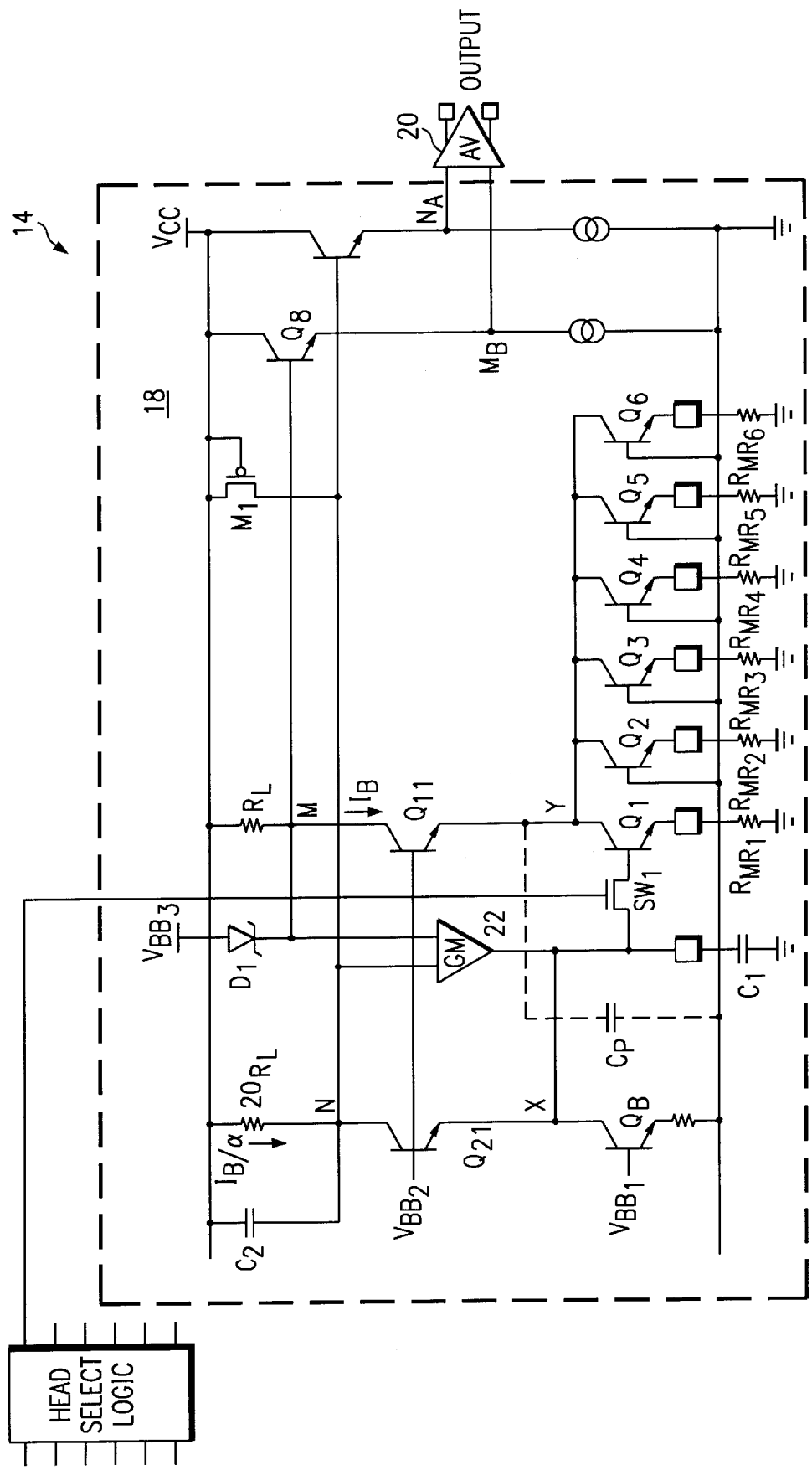
FIG. 2 is a prior art drawing illustrating the initial amplification stage of the preamplifier of FIG. 1.

Referring to prior art FIG. 2, it is seen that all six read head NPN input transistors Q1–Q6 are multiplexed together at node Y. This represents a huge parasitic capacitance Cp arising from the total of six bipolar transistors collector to substrate capacitances and results in a lot of noise being coupling into node Y. In the preferred embodiment of FIG. 4, this parasitic capacitance is divided out by connecting the head-input transistors into banks. Two input transistors Q1 and Q2 are connected to node Y, two input transistors Q3 and Q4 are connected to node Z and two input transistors Q5 and Q6 are connected at node P. The parasitic capacitance of two transistors is less than that of all six transistors. Since only one bank is active at a time (in FIG. 4 the bank with node Y is active) the parasitic capacitance of only one bank couples noise at a time. This effectively solves the noise rejection that comes from the MR head input transistor collector to substrate capacitance at node Y.

Nodes Y, Z and P are established in FIG. 4 and these nodes are multiplexed together at node M by transistors Q11, Q12 and Q13. Comparing FIG. 4 to prior art FIG. 2, it is seen that prior art FIG. 2 has only one transistor Q11. The advantageous circuit of FIG. 4 replicates transistor Q11 two times to provide a total of three transistors Q11–Q13. The transistors are combined at their collectors and thus nodes Y, Z and P are combined. The total parasitic substrate to collector capacitance stays the same as that of Q11 in FIG. 2 by decreasing the size of the transistors in FIG. 4 to about ⅓ the size of Q11 in prior art FIG. 2. Thus, the total parasitic capacitance from the three transistors Q11–Q13 in FIG. 4 remains the same as that of Q11 in prior art FIG. 2. Transistors Q11–Q13 may also be significantly smaller than transistors Q1–Q6 without sacrificing performance.

Another weakness of prior art FIG. 2 is that noise could come into node M from the collector of transistor Q11. As will be explained below, the inventive circuit of FIG. 4 solves this problem.

Figure 5:
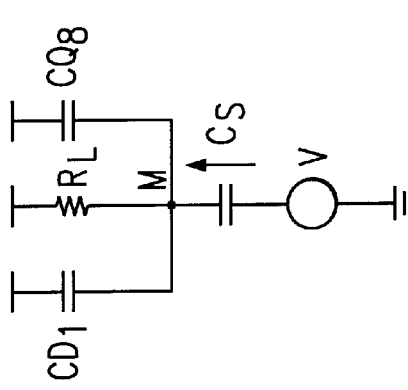
FIG. 5 is drawing illustrating schematically the impedance at node M of FIG. 4.

FIG. 5 depicts the impedance at node M. CDI represents the substrate capacitance of diode D1. Cs represents the substrate capacitance of transistors Q11–Q13. CQ8 represents the substrate capacitance of transistor Q8. Ac noise would come through the substrate capacitance Cs of transistors Q11–Q13.

Figure 6:
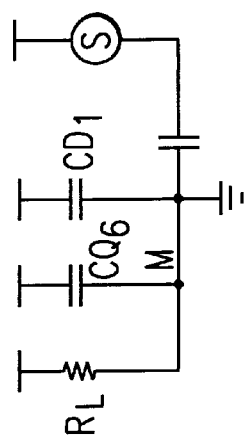
FIG. 6 is a drawing illustrating the equivalent of FIG. 5.

FIG. 6 is the equivalent of FIG. 5. For ac noise, the capacitance CQ8 and CD1 can be considered to have a ground connection. The dc voltage at node M needs to be equal to the dc voltage at node N for the differential inputs to later gain stage amplifier 20. If the dc voltages are equal in value, the inputs are common mode and only the ac portion of the signal is amplified out. Hence, the objective is to replicate the noise existing on node M to that of node N so that they cancel out.

Figure 7:
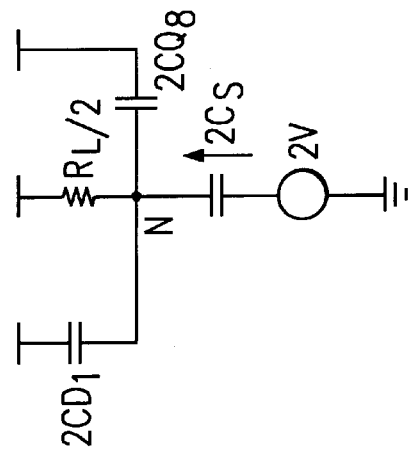
FIG. 7 is a drawing illustrating a schematic replication of node M of FIG. 4 at high frequencies.

FIG. 7 illustrates how to replicate node M. As stated above, the capacitor C2, at high frequencies (such as those over the useable HDD storage bandwidth), is essentially a short. It is therefore not illustrated. The scaling resistor 20R1 in parallel with the resistor R1/2 virtually has no effect as R1/2 dominates; therefore, it is not shown. From prior art FIG. 2, there is only one transistor Q21. Its substrate capacitance allows noise into the circuit. In the preferred embodiment of FIG. 4, there are six transistors Q21–Q26. In FIG. 4, the noise coming into node N is doubled. With three transistors Q11–Q13 on the node M side, six transistors Q21–Q26 are put on the reference side node N. Twice the capacitance couples twice the noise. Although twice the noise exists on node M, we need to match the same amount of noise on node N. In FIG. 7, 2Cs represents double the capacitance, but half the impedance. To match the frequency response, the rest of the impedance needs to be cut in half. This why the balancing resistor R1/2 is one half the value of the load resistor R1. The capacitance is doubled, so its impedance is half. Adding diodes D2 and D3 doubles the capacitance of diode D1. Adding transistors Q10 and Q9 in FIG. 4 doubles the capacitance of transistor Q8. By doubling the capacitances and halving the resistances, any ac signal that comes to node N has the same ac frequency response as node M. Since the ac portions are the same, the differential amplifier 20 cancels them out. So, in short, the frequency response of node N is matched to that of node M. Therefore, the poles of node N are matched to node M. Since the poles of nodes M and N are matched, any substrate noise coming into the circuit from the three transistors Q11–Q13 has no effect.

Figure 9:
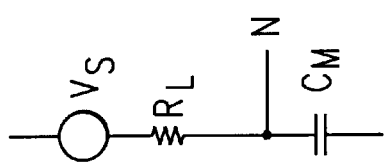
FIG. 9 illustrates the impedance on node M of FIG. 4 at high frequencies.
Figure 8:
FIG. 8 illustrates the impedance on node N of FIG. 4 at high frequencies.

A potential weakness with FIG. 2 is that Vcc power supply noise could get into the circuit through coupling at nodes M and N. Capacitor C2 functions as a short at high frequencies, so, noise goes to node N. On the M node side, noise can go through resistor R1. Assume that a voltage Vs on node N exists because of noise on the supply. A mismatch exists between nodes M and N and consequently the noise will be amplified by the differential amplifier 20. To make the two signals match, pole matching is again used in FIG. 4. R1/2 is used in series with C2 and twice as many transistors as transistor Q11 of FIG. 2 and twice as many diodes as D1 of FIG. 2 are added in FIG. 4. Transistors Q10 and Q9 provide twice the capacitance on node N as do diodes D2 and D3. FIG. 8 illustrates the impedance on node N and FIG. 9 represents the impedance on node M. Cm represents the capacitance on node M. Hence, Vcc noise is effectively eliminated by using the pole matching technique used to reduce substrate capacitances.

Another point of potential noise introduction into FIG. 2 is through the MOS transistor SW1 as noise from its substrate could get into transistor Q1. Also, the magneto resistive head picks up noise. This noise appears on the emitter of input transistor Q1. To reduce this possibility, in the preferred embodiment of FIG. 4, the substrate of the MOS transistor SW1 is connected to the magnetic read ground. Having this substrate coupled to magneto resistive head ground, any noise that couples to the MR element is the same as Q1 emitter and is the same on switch SW1. When bipolar transistor Q1 sees the signal, it sees only the base to emitter voltage. This is the voltage that is amplified. So, because of the substrate to MR head ground connection, the noise on Rmr becomes rejected, as it is common mode to transistor Q1 base emitter. Also, the capacitor C1 ground connects to MR ground instead of to integrated circuit ground to further improve noise rejection. If capacitor C1 is internal to the port, this will be connected to a separate pin which connects to MR ground.

In summary explanation of the above, the inventive circuit of FIG. 4 effectively handles four potential avenues of noise injection. The first way of noise injection is through node Y by the substrate capacitances of bipolar transistors Q1 and Q2. To reduce this, there are established multiple banks of nodes Y, Z and P with bipolar transistors Q11–Q13 of FIG. 4 being about one-third the size of transistor Q11 of prior art FIG. 2. This reduces substrate capacitance and therefore couples less noise. The second way of noise injection is through transistor Q11–Q13 substrate capacitances. To reduce this, the frequency response of nodes N and M are matched in FIG. 4. In other words, the poles of nodes N and M are matched. The substrate noise coming into node M is matched to the substrate noise coming into node N. This noise gets rejected because it is common mode to the differential amplifier 20. The third way noise could come in to FIG. 4 is through the power supply Vcc. On the M side of differential amplifier 20, it could get through the resistor R1. On the N side, it could get through the resistor R1/2. The same method works to reduce Vcc noise; that is, the poles of nodes N and M are matched in FIG. 4. The Vcc noise getting into node M is the same as the Vcc noise getting into node N. This becomes common mode and gets rejected by the differential amplifier 20. Between nodes N and M, node N has double the capacitance as node M and node N has one half the resistance as node M. This effectively matches the poles. The fourth way is through the MOS switch SW1. By connecting the substrate to head ground, the substrate noise injected is minimized.

While the invention has been particularly shown and described by the foregoing detailed description, it will be understood by those skilled in the art that various other changes in form and detail may be made without departing from the spirit and scope of the invention as defined by the following claims.

What is claimed is:

1. A preamplifier for a mass storage device, comprising:
    a single-ended amplifier having a signal input at a first node and a constant voltage input at a second node; and
    a plurality of input transistors connected to a plurality of magnetoresistive heads, the plurality of input transistors grouped into multiple banks that are multiplexed together at the first node.

2. The preamplifier of claim 1 wherein the multiple banks that are multiplexed together each have a single ended cascode transistor that is connected to a common load resistor at the first node.

3. The preamplifier of claim 2 wherein the constant voltage input of a differential amplifier is coupled to a second node formed by a capacitor and resistor in series combination parallel with a reference resistor, and further comprising;
    a transconductance amplifier having a first input connected to the first node and a second input connected to the second node, and having an output selectively coupled to the plurality of input transistors, and wherein,
    the load resistor, the capacitor and resistor in series combination paralleled with a reference resistor, the transconductance amplifier, the plurality of single ended drive transistors and the plurality of input transistors are included in said single ended amplifier.

4. The preamplifier of claim 3 wherein the frequency response of the single ended amplifier at the first node is matched to the frequency response of the single ended amplifier at the second node.

5. The preamplifier of claim 4 wherein the output of the transconductance amplifier that is selectively coupled to the plurality of input transistors is selectively coupled by metal-oxide-semiconductor transistors having substrate connections connected to ground potential of the magnetoresistive head.

* * * * *